(12) United States Patent
Köpken (10) Patent No.: US 6,990,415 B2
(45) Date of Patent: Jan. 24, 2006

(54) EVALUATION CIRCUIT FOR A CURRENT SENSOR USING THE COMPENSATION PRINCIPLE, IN PARTICULAR FOR MEASURING DIRECT AND ALTERNATING CURRENTS, AND A METHOD FOR OPERATING SUCH A CURRENT SENSOR

(75) Inventor: Hans-Georg Köpken, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 104 days.

(21) Appl. No.: 10/388,315

(22) Filed: Mar. 13, 2003

(65) Prior Publication Data

US 2004/0204875 A1    Oct. 14, 2004

Related U.S. Application Data

(63) Continuation of application No. PCT/DE01/03356, filed on Sep. 3, 2001.

(30) Foreign Application Priority Data

Sep. 13, 2000  (DE) ................ 100 45 194

(51) Int. Cl.
*G01R 15/00* (2006.01)
(52) U.S. Cl. .................... 702/57; 324/547
(58) Field of Classification Search ................ 702/57, 702/64–66, 104, 106–107, 124, 126, 183, 702/189; 324/546–547, 602–603, 605–607; 323/264, 331–332, 356–357; 363/41
See application file for complete search history.

(56) References Cited

U.S. PATENT DOCUMENTS 4,629,974 A * 12/1986 Friedl ...................... 323/357
5,510,689 A *  4/1996 Lipo et al. ................. 318/809
5,559,419 A *  9/1996 Jansen et al. .............. 318/808
5,565,765 A * 10/1996 Lenhard .................. 324/117 R
5,672,963 A *  9/1997 Corrigall et al. ........... 323/339
5,701,253 A   12/1997 Mayell et al.
5,751,138 A *  5/1998 Venkata et al. ............. 323/207

(Continued)

FOREIGN PATENT DOCUMENTS

DE    37 18 857 A1    12/1988

(Continued)

OTHER PUBLICATIONS

Haque et al., "A PI stator resistance compensator for a direct torque controlled interior permanent magnet synchronous motor drive", Aug. 15-18, 2000, Power Electronics and Motion Control Conference, vol. 1, pp. 175-179.*

*Primary Examiner*—Marc S. Hoff
*Assistant Examiner*—Mary Catherine Baran
(74) *Attorney, Agent, or Firm*—Henry M. Feiereisen (57) ABSTRACT

A current sensor using the compensation principle, in particular for measuring direct and alternating currents, includes an entirely digital evaluation circuit for signal processing. This substantially lowers the cost of the control electronics, in particular through integration in an ASIC. The magnetic field probe is, for example, supplied with a square wave voltage of a predetermined frequency, the probe signal is recorded by one or two comparators and the pulse width is digitally measured by counters. Furthermore, the conventional analog final stage for the compensation current is replaced by a PWM end stage with a series connected sigma-delta modulator. The square wave can be synchronized with a defined synchronization signal, which can be derived, for example, from the processed measurement values.

21 Claims, 3 Drawing Sheets

U.S. PATENT DOCUMENTS 5,815,381 A * 9/1998 Newlin .................. 363/17
6,020,732 A * 2/2000 Wood .................. 323/356
6,381,150 B2 * 4/2002 Telefus .................. 363/15

FOREIGN PATENT DOCUMENTS

| | | |
|---|---|---|
| DE | 41 28 989 C2 | 3/1993 |
| DE | 41 42 342 C2 | 6/1993 |
| DE | 42 30 939 C2 | 3/1994 |
| DE | 196 42 472 A | 4/1998 |
| DE | 196 42 472 A1 | 4/1998 |
| DE | 197 05 767 C2 | 8/1998 |
| DE | 198 44 726 A1 | 4/2000 |
| EP | 0 686 850 A | 12/1995 |
| EP | 0 710 844 C2 | 5/1996 |

* cited by examiner

EVALUATION CIRCUIT FOR A CURRENT SENSOR USING THE COMPENSATION PRINCIPLE, IN PARTICULAR FOR MEASURING DIRECT AND ALTERNATING CURRENTS, AND A METHOD FOR OPERATING SUCH A CURRENT SENSOR

CROSS-REFERENCES TO RELATED APPLICATIONS

This application is a continuation of prior filed copending PCT International application no. PCT/DE01/03356, filed Sep. 3, 2001, which designated the United States and on which priority is claimed under 35 U.S.C. §120, the disclosure of which is hereby incorporated by reference.

This application claims the priority of German Patent Application, Serial No. 100 45 194.2, filed Sep. 13, 2000, pursuant to 35 U.S.C. 119(a)–(d), the disclosure of which is incorporated herein by reference.

BACKGROUND OF THE INVENTION

The present invention relates to a current sensor for measuring direct and alternating currents, and more particularly to a current sensor operating by compensating a magnetic field introduced by the current.

Current sensors of this type are known in the art as compensation current transformers and measure direct and alternating currents by compensating the magnetic field generated in a magnet core by the measuring current with a compensation current in a secondary winding. The magnetic circuit includes a sensor, typically a magnetic field probe, that controls the compensation current by detecting deviations from a zero magnetic field. The secondary current accurately mirrors the current to be measured, as described, for example, in DE 3718857 A1.

To reduce the power requirement for the compensation current and to reduce losses, DE 19642472 A1 discloses the use of a clocked switching amplifier which is driven by a pulsed drive signal. Such compensation current transformers are useful, for example, for precision measurements of the motor currents of high-precision servo drives. In particular, the motor will only run true if the misadjustment of the compensation current transformer is very small (offset <0.1% over the temperature range).

However, it has proven difficult to directly implement a conventional peak-type rectification of the probe signal in an integrated circuit.

It would therefore be desirable and advantageous to provide an improved current sensor which obviates prior art shortcomings and which is highly accurate and also less expensive than conventional current transformers. Furthermore, it would be desirable and advantageous to be able to integrate the electronic system and operate, at least for smaller currents, with a single-sided 5V supply.

SUMMARY OF THE INVENTION

According to one aspect of the present invention, a method for operating a current sensor using the compensation principle, in particular for measuring direct and alternating currents, includes passing a current to be measured through a primary winding of a magnet core, thereby generating a primary magnetic field, passing a compensation current through a secondary winding of the magnet core, thereby generating a compensation magnetic field, controlling the compensation current so as to cause a total magnetic flux produced by the primary magnetic field and the compensation magnetic field to be zero, detecting deviations of the total magnetic flux from zero with a magnetic field probe and converting the detected deviations into a pulsed drive signal and amplifying the pulsed drive signal to obtain the compensation current, wherein the pulsed drive signal is derived from the probe current by the following steps:

exciting the magnetic field probe with a probe current at a predetermined frequency, thereby obtaining at least one potential that depends on the probe current, converting the at least one potential into at least one digital signal having discrete values by comparing the at least one potential with at least one threshold value, measuring characteristic time values of the at least one digital signal in the form of discrete values and discrete times, digitally controlling the magnetic flux to a zero value by using the at least one measured time value, in particular by PI control, and deriving binary switching signals, in particular by using pulse-width modulation (PWM) and/or sigma-delta modulation of a first or higher order.

According to another aspect of the invention, an evaluation circuit is provided for a current sensor using the compensation principle, in particular for measuring direct and alternating currents, wherein the current sensor comprises a magnet core having a primary winding and a secondary winding, with a current flowing through the primary winding producing a primary magnetic field and a compensation current flowing through the secondary winding producing a compensation magnetic field, at least one magnetic field sensor detecting a total magnetic flux produced by the primary magnetic field and the compensation magnetic field and producing a sensor signal, and an amplifier device controlling the compensation current in response to a switched drive signal.

The evaluation circuit is connected between the magnetic field sensor and the amplifier device and produces the switched drive signal in response to the sensor signal. The evaluation circuit may include a first oscillator with a predetermined frequency that excites the magnetic field sensor, at least one resistor located at a point traversed by the magnetic field sensor current and generating at least one potential dependent on a current flowing through the magnetic field sensor, at least one comparator that converts the at least one potential into at least one digital signal having a discrete value by comparing the at least one potential with at least one threshold value, at least one counter measuring characteristic time values of the at least one digital signal at discrete values and discrete times, a digital controller, in particular a PI controller, that controls the magnetic flux to zero by using at least one of the measured characteristic time values, and at least one of a second oscillator, in particular for pulse-width modulation, and a sigma-delta modulator operating in a first or higher order for deriving the pulsed drive signal for the amplifier device.

Alternatively, the evaluation circuit can also convert one or more potentials or voltages into one or more digital signals having discrete values by evaluating potential differences.

According to one feature of the present invention, the electronic drive system can hence be implemented in a fully digital fashion. For example, a square-wave voltage of a preset frequency (for example 250 kHz) is applied to the magnetic field probe, e.g. via resistors, the probe signal is detected by one or two comparators, and the pulse widths are measured using counters. In addition, the conventional analog output stage for the compensation current is replaced by a PWM output stage (with a frequency of, for example, 1 MHz) with an upstream sigma-delta modulator.

According to yet another advantageous feature of the invention, the characteristic times of the digital signals are measured by forming the difference between the times of the positive and the negative modulation amplitude of the magnetic field probe, with the time difference being controlled to zero so as to eliminate deviations from zero magnetic flux.

According to still another advantageous feature of the invention, the magnetic field probe frequency can be completely suppressed by synchronizing the excitation of the magnetic field probe with the derivation of binary switching signals, in particular through phase synchronization with a digital phase-locked loop. In this case, the evaluation circuit according to the invention has a synchronization device for synchronizing the first and the second oscillator, in particular a digital phase-locked loop providing phase synchronization.

Advantageously, an additional synchronization is performed with the downstream processing of the measurement values which can be synchronized with an existing ripple on the current to be measured.

Advantageously, the winding of the magnetic field probe can be briefly short-circuited during excitation, in particular for one clock cycle during every second or multiple measurement, in order to improve resolution.

According to another advantageous feature, the compensation current can be smoothed by using the inductance of the compensation winding.

Furthermore, the evaluation method according to the invention and the corresponding evaluation circuit can be integrated in an integrated circuit such as, for example, an Application-Specific Integrated Circuit (ASIC).

The evaluation circuit according to the invention can advantageously be used with a current sensor, using the compensation principle.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the Figures, same or corresponding elements are generally indicated by same reference numerals. These depicted embodiments are to be understood as illustrative of the invention and not as limiting in any way.

Figure 1:
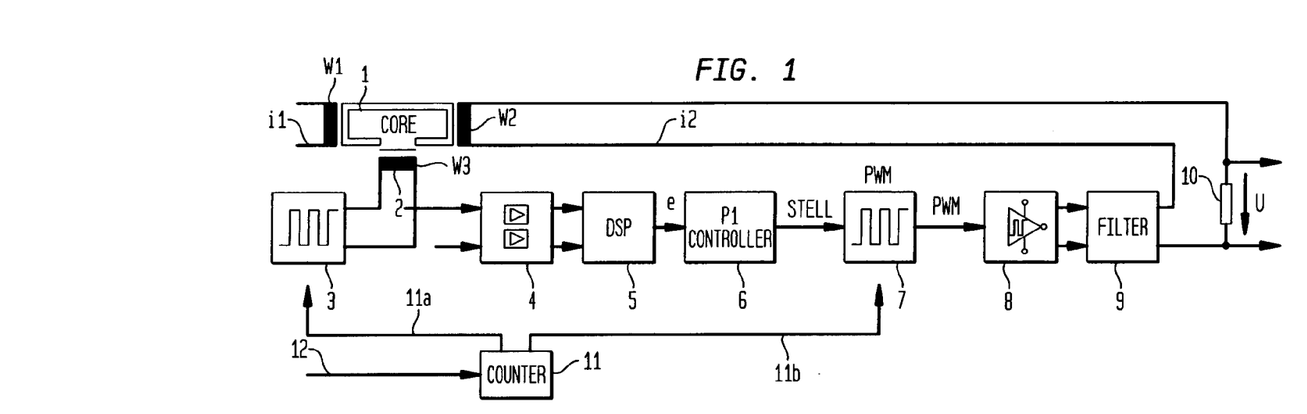
FIG. 1 shows a block diagram of a compensation current transformer with evaluation according to the invention.

Turning now to the drawing, and in particular to FIG. 1, there is shown a schematic diagram of a compensation current transformer, operating according to the evaluation method and having an evaluation circuit according to the invention. Shown on the left of FIG. 1 is the magnetic part, which includes a main core 1 with primary winding w1 and compensation winding w2, as well as a magnetic flux or magnetic field probe 2. The primary winding w1 conducts the measuring current i1 and has a substantially lower number of turns per unit length (possibly only one turn) than the compensation winding w2. The flux probe 2 consists, for example, of a Vitrovac® strip and a sensor coil w3.

The drive 3, an oscillator, excites the magnetic field probe 2. This is followed by the actual evaluation with the aid of the circuit blocks 4 to 7 (which will be described in more detail below) and by an output stage 8 operating in switched mode in order to control the compensation current i2 such that the magnetic flux vanishes. In this case, the compensation current i2 mirrors the primary current i1 and can be further processed. FIG. 1 also shows an exemplary filter 9 that filters the pulsed output voltage of the output stage 8. The filtered compensation current i2 is sent through the compensation winding w2 and generates via a terminating resistor 10, connected in series with the compensation winding w2, an output voltage signal U that is proportional to the compensation current i2 and likewise proportional to the measuring current i1 if a deviation from the zero flux can be successfully corrected.

The field probe 2 in the exemplary embodiment utilizes the extremely nonlinear, but exactly centro-symmetric magnetization profile of a Vitrovac® strip. The Vitrovac® strip is periodically driven into saturation in both directions by an AC voltage with a frequency of from 200 kHz to 500 kHz. The magnetic flux in the circuit produces an asymmetry that is evaluated.

Various types of excitation and evaluations can be envisioned:

1. Conventional excitation at resonance with a series capacitor and peak value rectification.
2. Providing a square-wave voltage via resistors, with switchover at saturation and pulse duty factor measurement.
3. Providing a square-wave voltage via resistors with a preset frequency and time difference measurement (present invention).

Conventional applications use the first variant which, however, is not suitable for integration into an application-specific integrated circuit (ASIC) because of the analog peak value rectification and the additional analog processing.

The present invention advantageously employs a novel fixed-frequency square-wave supply voltage (third variant) which moreover permits synchronization of the probe excitation with the switching frequency. The typically observed current ripple transmitted by magnetic coupling from the probe 2 onto the output current i2 that is observed with integrating current measurements is hereby eliminated without the need for expensive analog filters which limit the bandwidth.

Moreover, the pulse duty factor is evaluated in an entirely synchronous, purely digital implementation, and can thereby be integrated in an ASIC. The Vitrovac® material used in the magnetic field probe 2, or magnetic field sensor 2, has a very low coercive field strength (i.e., is soft magnetic), with a square hysteresis loop. When the total flux θ produced by the primary current i1 and compensation current i2 vanishes, the field strength in the sensor strip becomes proportional to the sensor current. The hysteresis loop applied to the sensor device by the sensor current has then the same form as the material-specific, centro-symmetric hysteresis loop induced by the magnetic field strength.

As soon as the total flux θ in the magnetic circuit becomes non-zero, the hysteresis curve introduced by the sensor current is shifted.

The current profile in the probe following an edge in the square-wave voltage is such that the inductance corresponds to the slope of the hysteresis curve which is constant over certain sections. The current profile therefore consists of decaying exponential functions whose time constant changes at the corresponding break points on the hysteresis curve.

The resulting profile has a short time constant (relatively steep time-dependence) at the beginning and at the end, and therebetween a flat region (corresponding to the steep section of the hysteresis loop), whose position is shifted depending on the total flux θ. The higher the total flux θ, the higher is the sensor current at which the flux shifts from positive to negative saturation. At a higher sensor current, however, a greater voltage drop is produced across a series resistor (not shown), which in turn lowers the voltage applied to the probe 2. Since the voltage-time area required for a flux reversal of the probe 2 is constant, the required time increases. Conversely, the other section of the hysteresis loop is shifted toward smaller sensor currents such that the time at the other edge decreases.

Figure 2:
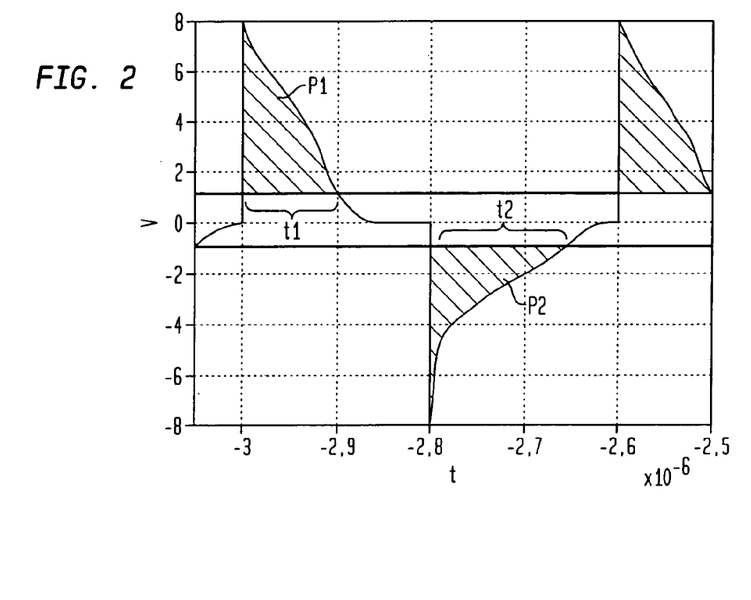
FIG. 2 shows detection of the probe voltage.

This asymmetry is clearly visible in the measured profile of the probe voltage, which is plotted against time t in the diagram of FIG. 2, when a flux θ is present.

The difference between the pulse widths t1 and t2 in FIG. 2 is to be evaluated. When the magnetic flux is zero, the pulses P1 and P2 have the same size, otherwise the pulses become different. Accordingly, the difference between the pulse widths—and thus the time difference between t1 and t2—should be controlled to zero.

Figure 3:
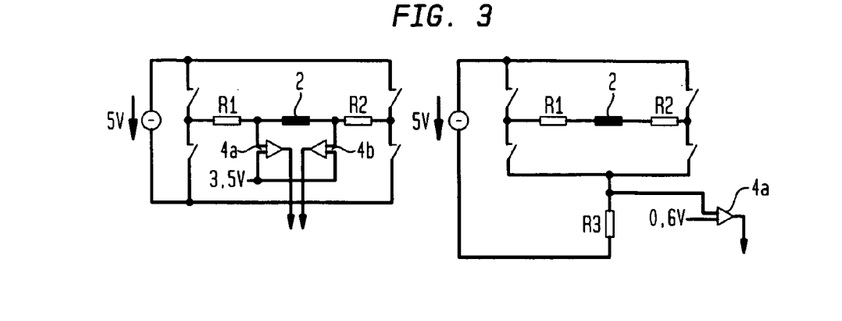
FIG. 3 shows the course of the magnetic field probe voltage.

For this purpose, the pulses P1 and P2 are converted into digital signals by two comparators 4a, 4b (FIG. 3) in a conversion device 4 shown in FIG. 1. FIG. 3 depicts two possible designs of the comparator circuit. The circuit on the left includes two comparators 4a, 4b, whereas the circuit on the right operates with only one comparator 4a.

The circuit on the left has a full-bridge arrangement for the magnetic field probe 2, which is supplied from a voltage source. The probe current flows through two resistors R1 and R2 located to the left and right of the probe 2 and connected in series. The resistors R1 and R2 generate voltages as a function of probe current, which are evaluated by the two comparators 4a, 4b.

As shown in FIG. 2, two switching thresholds are defined for the probe voltage: a first switching threshold slightly above zero (for example, between 0 and 2 V) and a second switching threshold slightly below zero (for example, between 0 and −2 V). In the case of a symmetric control, the probe voltage is always symmetric relative to 2.5 V, so that a measurement on one side of the coil, i.e., the magnet field probe 2, would be sufficient, with the thresholds 2.5V−2V/2=1.5 V and 2.5 V+2 V/2=3.5 V.

Since an asymmetry in the switching thresholds can cause an offset, the variant illustrated on the left side of FIG. 3, which requires only one switching threshold, is selected for the following discussions. When two comparators 4a, 4b are used, different offsets and switching times can cause a measurement error. This source of error can be avoided by the circuit variant according to FIG. 3 on the right, since the measurement is performed via a resistor R3 located in the common grounded arm of the bridge, requiring only one comparator 4a. However, the voltage swing is smaller and, when the gate is driven with reference to ground, the gate currents flow via the resistor during switching. Optionally, a capacitor (not shown) can be connected in parallel. Moreover, the gate voltage varies when the gate is driven with reference to ground, which limits the maximum permissible voltage drop across the measuring resistor R3.

The probe 2 is excited by a square-wave voltage with a preset frequency generated by block 3. To increase the resolution, the signal is shifted in a half bridge (two superpositioned switches depicted in FIG. 3) by one cycle every other period, so that 0V is briefly applied to the probe. This causes the end of the pulse to be shifted by approximately one half cycle, so that the pulse width measured with a digital counter at corresponding intermediate values alternates between two adjacent measured values.

The following discussion is directed to the variant with two comparators 4a, 4b.

If the probe 2 is excited by a square-wave generator 3 via resistors R1, R2 and a current i2 that varies slowly from −2 mA to 2 mA is applied to the compensation winding w2 (having for example 1000 turns), whereby the primary winding w1 remains open, then the position of the thresholds can be important, as seen from the compensation current and the resulting probe voltage.

It is evident that a shift does not produce an offset if both comparators 4a, 4b have the same threshold value. However, the linear operating range of the probe is greater for smaller threshold values. As expected, different threshold values produce an offset. The small offset that can be noticeable even with symmetric threshold values can be due to, for example, residual magnetism, external fields, etc.

The effect caused in the compensation current by errors in the time measurement (pulse-width measurement) can be determined from the slope of the curves. Such measurement errors are produced, for example, by transit time differences between the two comparators and by effects from the temporal quantization, since the pulse width in a clock-synchronized design can only be determined with an accuracy of half a clock signal.

Switching "zero pointers", or short circuiting the sensor winding during one cycle, shifts the current curve by approximately half a cycle. If this occurs at every other measurement, then the resolution can be increased on the average by a 1 bit. The effect of offset errors of the comparators can be determined from curves shifts at different thresholds.

The magnetic flux is controlled to zero with a (Proportional-Integral) PI controller 6 (see FIG. 1). A variation in the primary current i1 first causes a corresponding jump in the secondary current due to the direct magnetic coupling, whereas the magnetic flux (and thus the control circuit) initially does not respond. The secondary current then begins to decay so that the total flux in circuit 1 is no longer zero, and a magnetic flux is produced that it is detected by the probe 2. The PI controller 6 now begins to increase the secondary current until the flux remains constant at zero.

The integral component (I component) ensures that a time-independent deviation vanishes. The time-independent error is thus determined exclusively by the measuring accuracy of the field probe 2.

A pulse-width-modulation output stage 7 (PWM) is used as final control element. A high switching frequency (typically 1 MHz) and an LC filter 9 (typically 100 μH, 100 mF) are used to keep the current ripple at the switching frequency small. The dynamic response of the LC filter 9 and of the compensation winding w2 must be taken into account when setting the PI controller 6.

Figure 4:
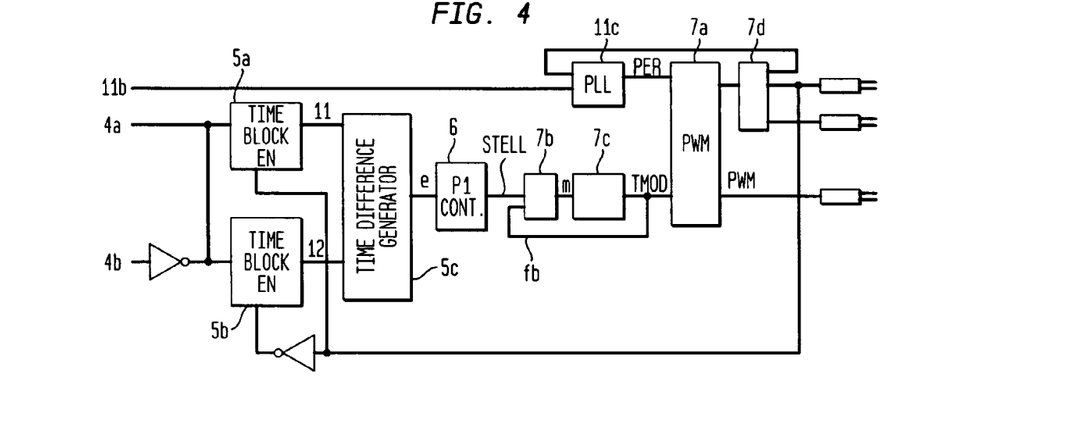
FIG. 4 shows an exemplary block diagram of a digital signal processor.

FIG. 4 depicts a block diagram of the digital signal processing circuit according to the invention which will be described below in more detail.

The resolution of the PWM output stage 8, that is driven in a clock-synchronized fashion, is relatively low. At a system clock frequency of 80 MHz and a PWM output frequency of 1 MHz, a resolution of 80 steps or less than 7-bit is obtained. Although the PI controller 6 can detect and compensate quantization errors in the resulting flux, relatively large oscillations at a low frequency can occur.

The desired voltage can be set to an average value with a second-order sigma-delta modulator 7b connected upstream of the PWM unit 7a by varying the pulse duty factor. The pulse duty factor can be varied so that the deviations are at the highest possible frequency and are therefore effectively suppressed by the low pass filters (LC filter 9 and compensation winding w2), followed by an integrating current detection.

The probe is excited by block 3 synchronously with the PWM output by a corresponding clock signal 11a, having for example a quarter of the PWM output frequency, i.e. 250 kHz. The entire signal processing is performed, for example, synchronously with a system clock of, for example, 80 MHz.

The jitter typically produced between asynchronously running subsystems is non-critical for system performance at the high clock frequency. A phase shifter 11c (digital phase-locked loop PLL) makes it possible to synchronize the PWM 7, 7a and the probe excitation 3 with a preset external signal 12 (which typically corresponds to the current controller sampling rate of, for example, 16 kHz). The synchronization is performed via counters 11 such that the resulting PWM signal tracks the external synchronizing signal 12 with a jitter of one or more periods of 80 MHz.

The entire system operates in a clock-synchronized fashion, for example at 80 MHz or 40 MHz. The digital PLL 11c, which includes a square-wave signal generator 7d, shown in FIG. 4. controls the frequency so that the probe is excited in phase-locked fashion relative to the externally preset synchronization signal 12. Only a slight jitter of a few periods at 80 MHz remains, corresponding a few 10 ns. The PWM output stage 7a switches in a phase-synchronized manner with the probe excitation 3.

As shown in the block diagram of the digital compensation control depicted in FIG. 4, the signals provided on the input side by the comparators 4a, 4b are further processed by two timer blocks 5a, 5b which measure the pulse widths t1, t2 of the positive and the negative probe voltages P1, P2. As described above, different comparators 4a, 4b or the same comparator 4a can be used for both pulses P1, P2, depending on configuration. The output signal is the pulse width as measured in pulse cycles of the system clock.

The following block 5c generates the time difference and outputs this difference as a signal e to the PI controller 6. If a preset maximum time difference is exceeded and the pulse duration is less than a preset minimum pulse duration, then the output signal of block 5c is held at the corresponding maximum value.

As already mentioned, a PI controller 6 with limit control has proven to be advantageous as a flux controller.

In order to optimize the performance for large steps, the value for limiting the dynamic performance can be reduced so as to prevent the integrator from operating outside the rated range of the PWM.

The actual pulse-width modulation is performed in block 7a. This block receives the period per from the phase shifter 11c, and the turn-on time tmod from the quantization block 7c. Since only 80 steps can be set for the pulse duty factor at a PMW frequency of 1 MHz and a crystal frequency of 80 MHz, quantization is taken into account. The quantization is performed in block 7c, which receives the desired voltage as a signed value with fractional digits, and receives the period m from the sigma-delta modulator 7b. The switchover time is calculated therefrom, and the signal fb which corresponds to the obtained voltage is generated as feedback and fed back to the input of the sigma-delta modulator 7b.

Figure 5:
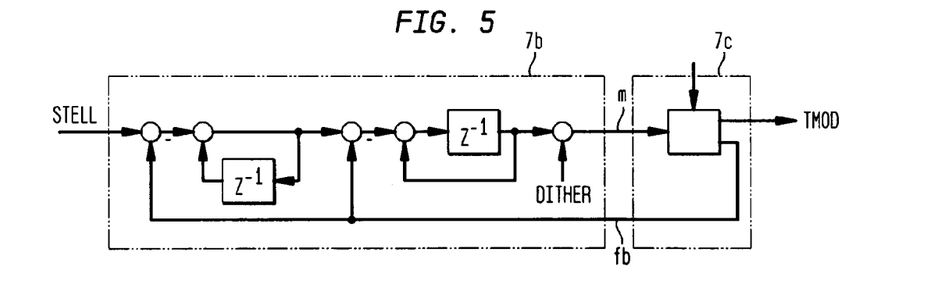
FIG. 5 shows an exemplary design of a Sigma-Delta modulator, and FIGS. 6 A–C show possible variants for integration of the evaluation circuit into an ASIC.

The block 7b includes a second-order sigma-delta modulator. An exemplary embodiment of the sigma-delta modulator 7b with subsequent quantization 7c is depicted in FIG. 5. The PI controller 6 presets the control variable "stell" on the input side. The sigma-delta modulator 7b supplies an unquantized signal m that represents an input signal for the subsequent quantization 7c. The quantization 7c supplies in addition to the turn-on time tmod the feedback signal fb. FIG. 5 shows how fb is fed back exactly to the sigma-delta modulator 7b.

For values that can be obtained exactly (i.e., when the quantized signal fb is equal to the unquantized signal m), the sigma-delta modulator 7b operates with a dead time of one cycle. For intermediate values that cannot be obtained exactly, the signal m changes back and forth by several LSB (low significant bits) above and below the signal "stell". An additional digital pseudo-noise signal "dither" can be supplied to prevent limit cycles, as illustrated in FIG. 5.

Here, the dual integrator structure causes the amplitude of the resulting noise spectrum to vary as the square of the frequency over a wide frequency range. As a result, the noise is extremely low in the useful signal range at low frequencies. The greater noise amplitudes in the higher-frequency range are suppressed by the LC filter 9 (see FIG. 1) and the inductance of the compensation winding w2.

A limit value of the sigma-delta modulator 7b should be set to a high value; a limitation based on the control range should be performed in the PI controller 6. The limit value set in the PI controller 6 should preferably be able to accommodate the noise produced by the sigma-delta modulator 7b.

Desirable cost saving over conventional compensation converters can be achieved by integrating the evaluation or signal processing according to the invention in an ASIC. The required functional blocks can be subdivided or distributed over one or more ASICs in various ways. Several exemplary embodiments are shown in FIG. 6.

Figure 6A:
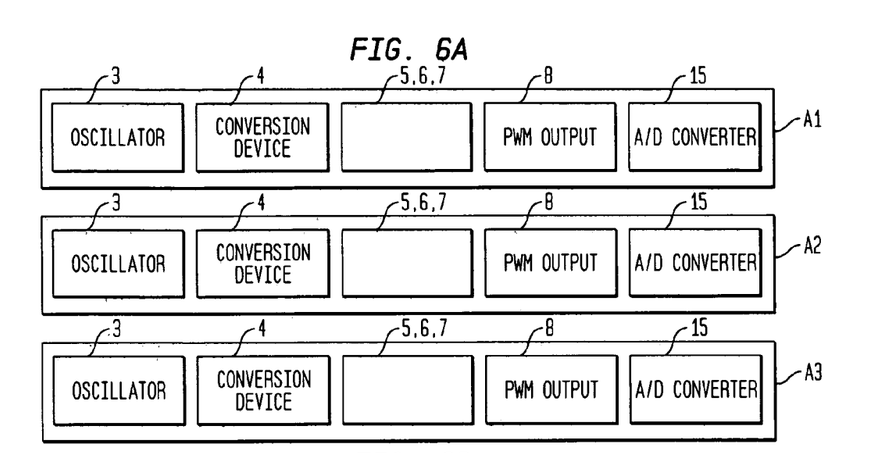
Figure 6B:
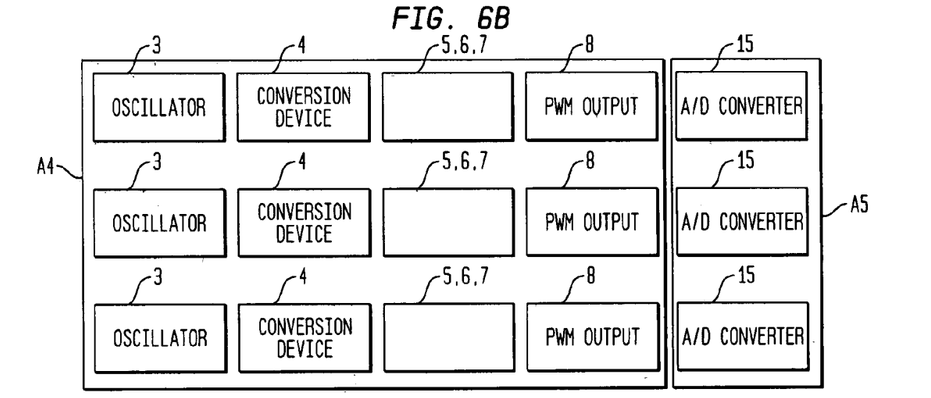
Figure 6C:
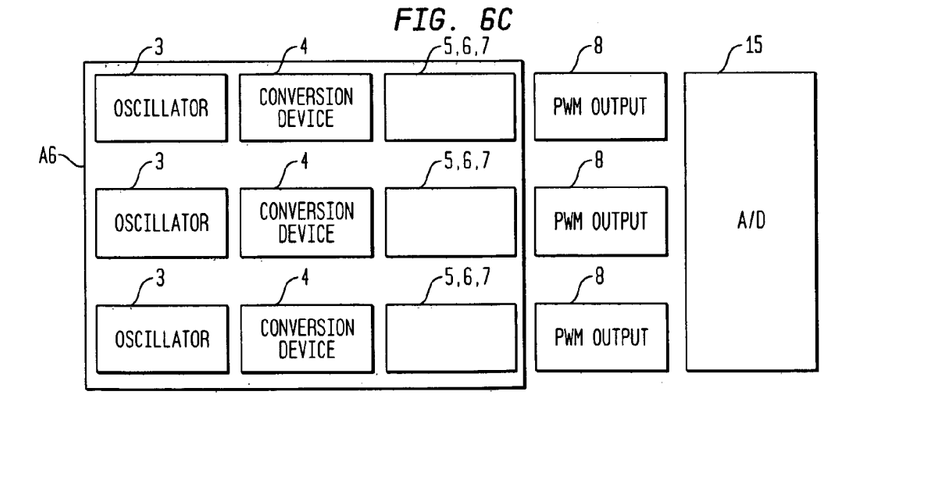

FIG. 6a shows a complete, integrated electronic system for single-phase current measurements. Three identical ASICs A1 to A3 are provided for a three-phase system. Each ASIC has an excitation source 3, a switching threshold generator 4 with comparators (see FIG. 3), a block for digital signal processing wherein the elements 5, 6, 7 correspond to those in the block diagram of FIG. 4, an amplifier device in the form of an output stage 8 and, in addition, an analog-to-digital converter 15 for converting the output voltage drop U across the resistor 10 that is proportional to the measuring current i1.

This variant allows the electronic system to be placed directly at the magnetic part of the current transformer, which may be advantageous for larger systems. Moreover, single-phase or two-phase measurement are also possible, with three ASICs being required for the more common three-phase measurement. The large-scale manufacture of these parts enables cost-effective mass production.

If the ASIC is designed for a cost-effective 5 V CMOS process, then the output stages can not be operated with supply voltages of ±15 V. Circuits requiring ±15 V output stages would then need an additional output stage. All the functions for three phases could also be combined in a single ASIC.

In an alternative embodiment illustrated in FIG. 6b, the circuit is divided into a digital ASIC section A4 and a mixed-signal ASIC section A5 (which includes the analog-to-digital converters 15 for all three phases). The design and development of a purely digital ASIC are substantially lower; moreover, the sections with a high clock rate and the output stages operating at high current are separated from the sensitive A/D converters 15. It is to be kept in mind that a "digital" ASIC requires a comparator with a defined switching threshold and large output stage transistors.

In the embodiment illustrated in FIG. 6c, the output stages 8 are also separated from the ASIC A6. When a ±15 V supply and external output stages 8 are used, the burden effective resistor 10 can be connected at one end to a fixed reference potential, for example 2 V. This permits the use of more favorable A/D converters, for example with an input range of from 0 V to 4 V, like those integrated in some microcontrollers.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed is:

1. A method for operating a current sensor according to the compensation principle for measuring direct and alternating currents, comprising the steps of:
   passing a current to be measured through a primary winding of a magnet core, thereby generating a primary magnetic field,
   passing a compensation current through a secondary winding of the magnet core, thereby generating a compensation magnetic field,
   controlling the compensation current so as to cause a total magnetic flux produced by the primary magnetic field and the compensation magnetic field to be zero,
   detecting deviations of the total magnetic flux from zero with a magnetic field probe and converting the detected deviations into a pulsed drive signal and amplifying the pulsed drive signal to obtain the compensation current,
   wherein the pulsed drive signal is derived from the probe current by the following steps:
   exciting the magnetic field probe with a probe current at a predetermined frequency, thereby obtaining at least one potential that depends on the probe current,
   converting the at least one potential into at least one digital signal having discrete values by comparing the at least one potential with at least one threshold value,
   measuring characteristic time values of the at least one digital signal in the form of discrete values and discrete times,
   digitally controlling by (Proportional-Integral) PI control the magnetic flux to a zero value by using the at least one measured time value, and
   deriving binary switching signals by using at least one of pulse-width modulation (PWM) and sigma-delta modulation of a first or higher order.

2. The method of claim 1, wherein measuring the characteristic time values includes the steps of forming a time difference between a time determined of a positive magnetic field probe modulation amplitude and a time determined of a negative magnetic field probe modulation amplitude, and controlling the time difference to be zero, thereby eliminating deviations of the total magnetic flux from zero.

3. The method of claim 1, wherein excitation of the magnetic field probe and derivation of the binary switching signals is synchronized.

4. The method of claim 3, and further comprising the step of synchronizing the excitation of the magnetic field probe with a subsequent processing of the derived binary switching signals in a phase-synchronized fashion by a digital phase-locked loop.

5. The method of claim 1, and further comprising the step of briefly short-circuiting a winding of the magnetic field probe during excitation for one clock cycle with each second or multiple measurement, thereby increasing the resolution.

6. The method of claim 1, wherein the inductance of the compensation winding smoothes the compensation current.

7. A method for operating a current sensor according to the compensation principle for measuring direct and alternating currents, comprising the steps of:
   passing a current to be measured through a primary winding of a magnet core, thereby generating a primary magnetic field,
   passing a Compensation current through a secondary winding of the magnet core, thereby generating a compensation magnetic field,
   controlling the compensation current so as to cause a total magnetic flux produced by the primary magnetic field and the compensation magnetic field to be zero,
   detecting deviations of the total magnetic flux from zero with a magnetic field probe and converting the detected deviations into a pulsed drive signal and amplifying the pulsed drive signal to obtain the compensation current,
   wherein the pulsed drive signal is derived from the probe current by the following steps:
   exciting the magnetic field probe with a probe current at a predetermined frequency, thereby obtaining at least one potential that depends on the probe current,
   convening the at least one potential into at least one digital signal having discrete values by evaluating differences in potential,
   measuring characteristic time values of the at least one digital signal in the form of discrete values and discrete times,
   digitally controlling by (Proportional-Integral) PI control the magnetic flux to a zero value by using the at least one measured time value, and
   deriving binary switching signals by using at least one of pulse-width modulation (PWM) and sigma-delta modulation of a first or higher order.

8. The method of claim 7, wherein measuring the characteristic time values includes the steps of forming a time difference between a time determined of a positive magnetic field probe modulation amplitude and a time determined of a negative magnetic field probe modulation amplitude, and controlling the time difference to be zero, thereby eliminating deviations of the total magnetic flux from zero.

9. The method of claim 7, wherein excitation of the magnetic field probe and derivation of the binary switching signals is synchronized.

10. The method of claim 9, and further comprising the step of synchronizing the excitation of the magnetic field probe with a subsequent processing of the derived binary switching signals processing in a phase-synchronized fashion by a digital phase-locked loop.

11. The method of claim 7, and further comprising the step of briefly short-circuiting a winding of the magnetic field probe during excitation for one clock cycle with each second or multiple measurement, thereby increasing the resolution.

12. The method of claim 7, wherein the inductance of the compensation winding smoothes the compensation current.

13. In a current sensor using the compensation principle for measuring direct and alternating currents, wherein the current sensor includes a magnet care having a primary winding and a secondary winding, with a current flowing through the primary winding producing a primary magnetic field and a compensation current flowing through the secondary winding producing a compensation magnetic field, at least one magnetic field sensor detecting a total magnetic flux produced by the primary magnetic field and the compensation magnetic field and producing a sensor signal, and an amplifier device controlling the compensation current in response to a switched drive signal, an evaluation circuit is connected between the magnetic field sensor and the amplifier device and producing the switched drive signal in response to the sensor signal, said evaluation circuit comprising:

a first oscillator with a predetermined frequency that excites the magnetic field sensor, at least one resistor located at a point traversed by the magnetic field sensor current and generating at least one potential dependent on a current flowing through the magnetic field sensor, at least one comparator that converts the at least one potential into at least one digital signal having a discrete value by comparing the at least one potential with at least one threshold value, at least one counter measuring characteristic time values of the at least one digital signal at discrete values and discrete times, a digital (Proportional-Integral) PI controller that controls the magnetic flux to zero by using at least one of the measured characteristic time values, and at least one of a second oscillator for pulse-width modulation, and a sigma-delta modulator operating in a first or higher order for deriving the pulsed drive signal for the amplifier device.

14. The evaluation circuit of claim 13, and further comprising a synchronization device for synchronizing the first oscillator and the second oscillator.

15. The evaluation circuit of claim 13, wherein the synchronization device comprises a phase digital phase-locked loop.

16. The evaluation circuit of claim 13, wherein the evaluation circuit is integrated into an integrated circuit, in particular into an ASIC.

17. In a current sensor using the compensation principle for measuring direct and alternating currents, wherein the current sensor includes a magnet core having a primary winding and a secondary winding, with a current flowing through the primary winding producing a primary magnetic field and a compensation current flowing through the secondary winding producing a compensation magnetic field, at least one magnetic field sensor detecting a total magnetic flux produced by the primary magnetic field and the compensation magnetic field and producing a sensor signal, and an amplifier device controlling the compensation current in response to a switched drive signal, an evaluation circuit connected between the magnetic field sensor and the amplifier device and producing the switched drive signal in response to the sensor signal, said evaluation circuit comprising:

a first oscillator with a predetermined frequency that excites the magnetic field sensor, at least one resistor located at a point traversed by the magnetic field sensor current and generating at least one potential dependent on a current flowing through the magnetic field sensor, at least one comparator that converts the at least one potential into at least one digital signal having a discrete value by evaluating potential differences, at least one counter measuring characteristic time values of the at least one digital signal at discrete values and discrete times, a digital (Proportional-Integral) PI controller that controls the magnetic flux to zero by using at least one of the measured characteristic time values, and at least one of a second oscillator for pulse-width modulation, and a sigma-delta modulator operating in a first or higher order for deriving the pulsed drive signal for the amplifier device.

18. The evaluation circuit of claim 17, and further comprising a synchronization device for synchronizing the first oscillator and the second oscillator.

19. The evaluation circuit of claim 17, wherein the synchronization device comprises a phase digital phase-locked loop.

20. The evaluation circuit of claim 17, wherein the evaluation circuit is integrated into an integrated circuit, in particular into an ASIC.

21. A current sensor using the compensation principle for measuring direct and alternating currents, comprising:

a magnet core having a primary winding and a secondary winding, with a current flowing through the primary winding producing a primary magnetic field and a compensation current flowing through the secondary winding producing a compensation magnetic field, at least one magnetic field sensor detecting a total magnetic flux produced by the primary magnetic field and the compensation magnetic field and producing a sensor signal, an amplifier device controlling the compensation current in response to a switched drive signal, an evaluation circuit connected between the magnetic field sensor and the amplifier device and producing the switched drive signal in response to the sensor signal, said evaluation circuit comprising:

a first oscillator with a predetermined frequency that excites the magnetic field sensor, at least one resistor located at a point traversed by the magnetic field sensor current and generating at least one potential dependent on a current flowing through the magnetic field sensor, at least one comparator that converts the at least one potential into at least one digital signal having a discrete value by comparing the at least one potential with at least one threshold value or by evaluating potential differences, at least one counter measuring characteristic time values of the at least one digital signal at discrete values and discrete times, a digital (Proportional-Integral) PI controller that controls the magnetic flux to zero by using at least one of the measured characteristic time values, and at least one of a second oscillator far pulse-width modulation, and a sigma-delta modulator operating in a first or higher order for deriving the pulsed drive signal for the amplifier device.

* * * * *

UNITED STATES PATENT AND TRADEMARK OFFICE
CERTIFICATE OF CORRECTION

PATENT NO. : 6,990,415 B2
DATED : January 24, 2006
INVENTOR(S) : Hans-Georg Köpken

It is certified that error appears in the above-identified patent and that said Letters Patent is hereby corrected as shown below:

Column 11,
Line 5, change "care" to -- core --.

Column 12,
Line 61, change "far" to -- for --.

Signed and Sealed this

Twenty-third Day of May, 2006

JON W. DUDAS
*Director of the United States Patent and Trademark Office*